(12) United States Patent
Dingman

(10) Patent No.: US 11,539,177 B2
(45) Date of Patent: Dec. 27, 2022

(54) VITAL RELAY ASSEMBLY FOR MODULAR SOLID-STATE CURRENT-LIMITING

(71) Applicant: Siemens Mobility, Inc., New York, NY (US)

(72) Inventor: Matthew Dingman, Floyds Knobs, IN (US)

(73) Assignee: Siemens Mobility, Inc., New York, NY (US)

( * ) Notice: Subject to any disclaimer, the term of this patent is extended or adjusted under 35 U.S.C. 154(b) by 91 days.

(21) Appl. No.: 17/056,828

(22) PCT Filed: Jun. 10, 2019

(86) PCT No.: PCT/US2019/036261
§ 371 (c)(1),
(2) Date: Nov. 19, 2020

(87) PCT Pub. No.: WO2019/241100
PCT Pub. Date: Dec. 19, 2019

(65) Prior Publication Data
US 2021/0218206 A1    Jul. 15, 2021

(51) Int. Cl.
*H01R 33/94* (2006.01)
*B61L 7/08* (2006.01)
(Continued)

(52) U.S. Cl.
CPC .......... *H01R 33/94* (2013.01); *B61L 7/08* (2013.01); *H01R 13/506* (2013.01); *H05K 1/181* (2013.01);
(Continued)

(58) Field of Classification Search
None
See application file for complete search history.

(56) References Cited

U.S. PATENT DOCUMENTS 3,258,654 A * 6/1966 Lutsch et al. ............ H02P 7/34
                                                                361/204
3,433,917 A * 3/1969 Hufnagel ............... H01H 3/001
                                                                335/196
(Continued)

FOREIGN PATENT DOCUMENTS

AU    2016204642 B2 * 4/2018 ............. B61L 29/22
CA       3063822 A1 * 11/2018 ............. H01R 13/74
(Continued)

OTHER PUBLICATIONS

Signaling Control: "Service and Repair Dec. 2011 Signaling and Control 100 Years of Experience Meets the Expertise and innovation of the Future", Jun. 30, 2011 (Jun. 30, 2011), XP 055307584 / Jun. 30, 2011.
(Continued)

*Primary Examiner* — Timothy J. Dole
*Assistant Examiner* — Muhammed Azam

(57) ABSTRACT

A relay assembly comprises a vital relay used in a vital circuit and configured to be rack-installed in an equipment room in a railroad case or a railroad housing for providing a modular solid-state current-limiting. The relay assembly further comprises a plurality of vital relay contacts to which a current flow is restricted by a single supply solid-state current limiter. The relay assembly further comprises a relay socket base assembly coupled to the vital relay. The relay socket base assembly includes a relay socket base including a plurality of vital relay contact prongs, a plug assembly including a plurality of printed circuit board (PCB) mounted contact terminals, and a plurality of contact terminals that provide a connection between the plurality of vital relay contact prongs and the plurality of printed circuit board (PCB) mounted contact terminals. The relay assembly further comprises an ancillary electrical control module.

14 Claims, 14 Drawing Sheets

(51) Int. Cl.
  *H01R 13/506* (2006.01)
  *H05K 1/18* (2006.01)
  *H05K 7/10* (2006.01)
  *H01R 33/88* (2006.01)
  *H01R 33/90* (2006.01)

(52) U.S. Cl.
  CPC ............ *H05K 7/103* (2013.01); *H01R 33/88* (2013.01); *H01R 33/90* (2013.01); *H05K 2201/10189* (2013.01); *H05K 2201/10545* (2013.01)

(56) References Cited

U.S. PATENT DOCUMENTS

| | | | | | |
|---|---|---|---|---|---|
| 3,461,411 | A | * | 8/1969 | Hufnagel | H01F 7/08 335/276 |
| 3,600,604 | A | * | 8/1971 | Thorne-Booth | H03F 3/72 326/14 |
| 3,887,152 | A | * | 6/1975 | Eblovi | B61L 3/225 246/63 C |
| 3,958,781 | A | * | 5/1976 | Woods | B61L 1/188 246/34 R |
| 4,029,274 | A | * | 6/1977 | Sibley | B61L 3/00 714/E11.017 |
| 4,041,283 | A | * | 8/1977 | Mosier | G09B 9/04 246/167 R |
| 4,042,810 | A | * | 8/1977 | Mosher | G09B 9/04 701/19 |
| 4,177,441 | A | * | 12/1979 | Lichtenberger | H01F 7/08 335/276 |
| 4,318,156 | A | * | 3/1982 | Gallagher | H02B 1/52 361/647 |
| 4,338,650 | A | * | 7/1982 | Wierschke | G05B 9/03 361/204 |
| 4,401,035 | A | * | 8/1983 | Spigarelli | B61C 17/12 105/61 |
| 4,558,415 | A | * | 12/1985 | Zuber | B60K 31/0058 246/187 B |
| 4,853,883 | A | * | 8/1989 | Nickles | G09B 9/04 348/121 |
| 5,922,034 | A | * | 7/1999 | Feely | B61L 19/06 701/19 |
| 6,259,978 | B1 | * | 7/2001 | Feely | B61L 19/06 701/19 |
| 6,304,188 | B1 | * | 10/2001 | Subak | H01R 13/6666 361/728 |
| 6,533,587 | B1 | * | 3/2003 | Potter | H01L 23/467 |
| 6,937,461 | B1 | * | 8/2005 | Donahue, IV | H01R 13/514 174/59 |
| 7,457,106 | B2 | * | 11/2008 | Ewing | H02B 1/20 439/55 |
| 7,794,233 | B1 | * | 9/2010 | Millard | H01R 12/62 439/67 |
| 7,934,959 | B2 | * | 5/2011 | Rephaeli | G02B 6/4284 439/620.22 |
| 9,330,562 | B2 | * | 5/2016 | Fox | G08C 17/02 |
| 9,722,381 | B1 | * | 8/2017 | Moen | H05K 7/1492 |
| 10,349,503 | B2 | * | 7/2019 | Hogan | H05B 47/25 |
| 10,672,578 | B2 | * | 6/2020 | Stuckey | H03K 17/284 |
| 10,849,253 | B2 | * | 11/2020 | Leigh | H05K 7/1488 |
| 10,871,421 | B2 | * | 12/2020 | Ferrell | G01M 17/08 |
| 2006/0044774 | A1 | * | 3/2006 | Vasavda | G02B 6/4284 361/796 |
| 2007/0291433 | A1 | * | 12/2007 | Ziegler | H01R 25/003 361/93.1 |
| 2009/0250236 | A1 | * | 10/2009 | Corwin | H01R 31/06 174/59 |
| 2010/0020475 | A1 | * | 1/2010 | Spitaels | H01R 13/6666 361/656 |
| 2014/0126118 | A1 | * | 5/2014 | Ewing | H01R 25/006 361/622 |
| 2014/0263856 | A1 | * | 9/2014 | Hann | B61L 27/30 246/3 |
| 2016/0095246 | A1 | * | 3/2016 | Noland | H05K 7/1489 361/752 |
| 2020/0366166 | A1 | * | 11/2020 | Kurihara | B62D 5/046 |
| 2020/0383248 | A1 | * | 12/2020 | Easton | C02F 1/008 |

FOREIGN PATENT DOCUMENTS

| | | | | |
|---|---|---|---|---|
| CA | 3065494 | A1 | * 12/2018 | ............ H01R 13/74 |
| CN | 2461821 | Y | * 11/2001 | |
| CN | 2461822 | Y | * 11/2001 | |
| CN | 204810304 | U | * 11/2015 | |
| CN | 107804253 | A | 3/2018 | |
| CN | 107804253 | A | * 3/2018 | ......... B60R 16/0231 |
| CN | 208544283 | U | * 2/2019 | ............ B61L 23/06 |
| CN | 109941294 | A | * 6/2019 | |
| CN | 111313367 | A | * 6/2020 | |
| CN | 210852469 | U | * 6/2020 | |
| CN | 210955564 | U | * 7/2020 | ............ G09B 9/00 |
| DE | 3323029 | C2 | 5/1989 | |
| DE | 19739503 | A1 | * 3/1999 | ......... H01R 13/4361 |
| DE | 10357468 | A1 | * 6/2005 | ......... H01R 13/6658 |
| EA | 001499 | B1 | * 4/2001 | |
| EP | 0393251 | A1 | * 10/1990 | |
| EP | 3257718 | A1 | * 12/2017 | |
| EP | 3357786 | A2 | * 8/2018 | ............ B61L 1/181 |
| EP | 3663162 | A1 | * 6/2020 | |
| GB | 2159994 | A | * 12/1985 | ......... B61L 15/0063 |
| GB | 2183066 | A | * 5/1987 | ............ G06F 11/006 |
| JP | 2001197601 | A | * 7/2001 | |
| JP | 5364749 | B2 | * 12/2013 | |
| JP | 3205816 | U | * 8/2016 | |
| JP | 2017010662 | A | 1/2017 | |
| KR | 20100035926 | A | * 4/2010 | |
| KR | 102116467 | B1 | * 5/2020 | |
| KR | 102133021 | B1 | * 7/2020 | |
| KR | 102176638 | B1 | * 11/2020 | |
| MA | 38939 | A1 | * 7/2016 | |
| WO | WO-2004025469 | A1 | * 3/2004 | ............ G05B 9/03 |
| WO | WO-2010042591 | A | * 4/2010 | ............ H04L 41/12 |
| WO | WO-2010042593 | A1 | * 4/2010 | ......... H01R 13/6658 |
| WO | WO-2015063297 | A1 | * 5/2015 | ............ H01R 13/506 |
| WO | WO-2016168260 | A1 | * 10/2016 | ............ G01R 21/00 |
| WO | WO-2017223539 | A1 | * 12/2017 | ............ A47B 47/00 |
| WO | WO-2019094088 | A1 | * 5/2019 | ............ C02F 1/008 |
| WO | WO-2019241100 | A1 | * 12/2019 | ............ B61L 1/181 |
| WO | WO-2020056527 | A1 | * 3/2020 | ......... H01M 10/0525 |
| WO | WO-2021066784 | A1 | * 4/2021 | ............ G01S 19/13 |

OTHER PUBLICATIONS

PCT International Search Report and Written Opinion of International Searching Authority dated Sep. 12, 2019 corresponding to PCT International Application No. PCT/US2019/036261 filed Jun. 10, 2019.

* cited by examiner

Detail B

Detail E

View C-C'

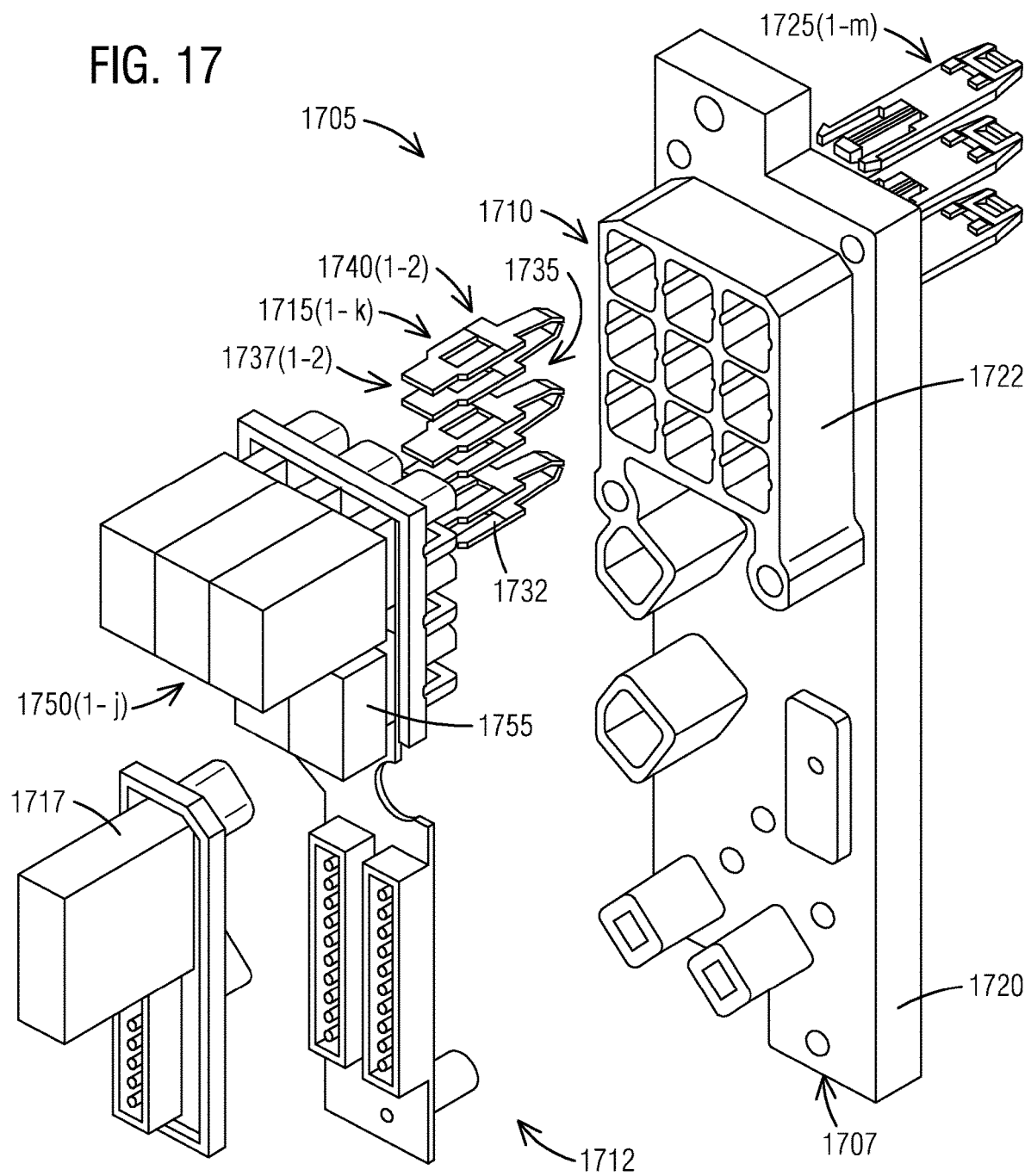

Detail B

Detail C

View A-A'

View A-A'

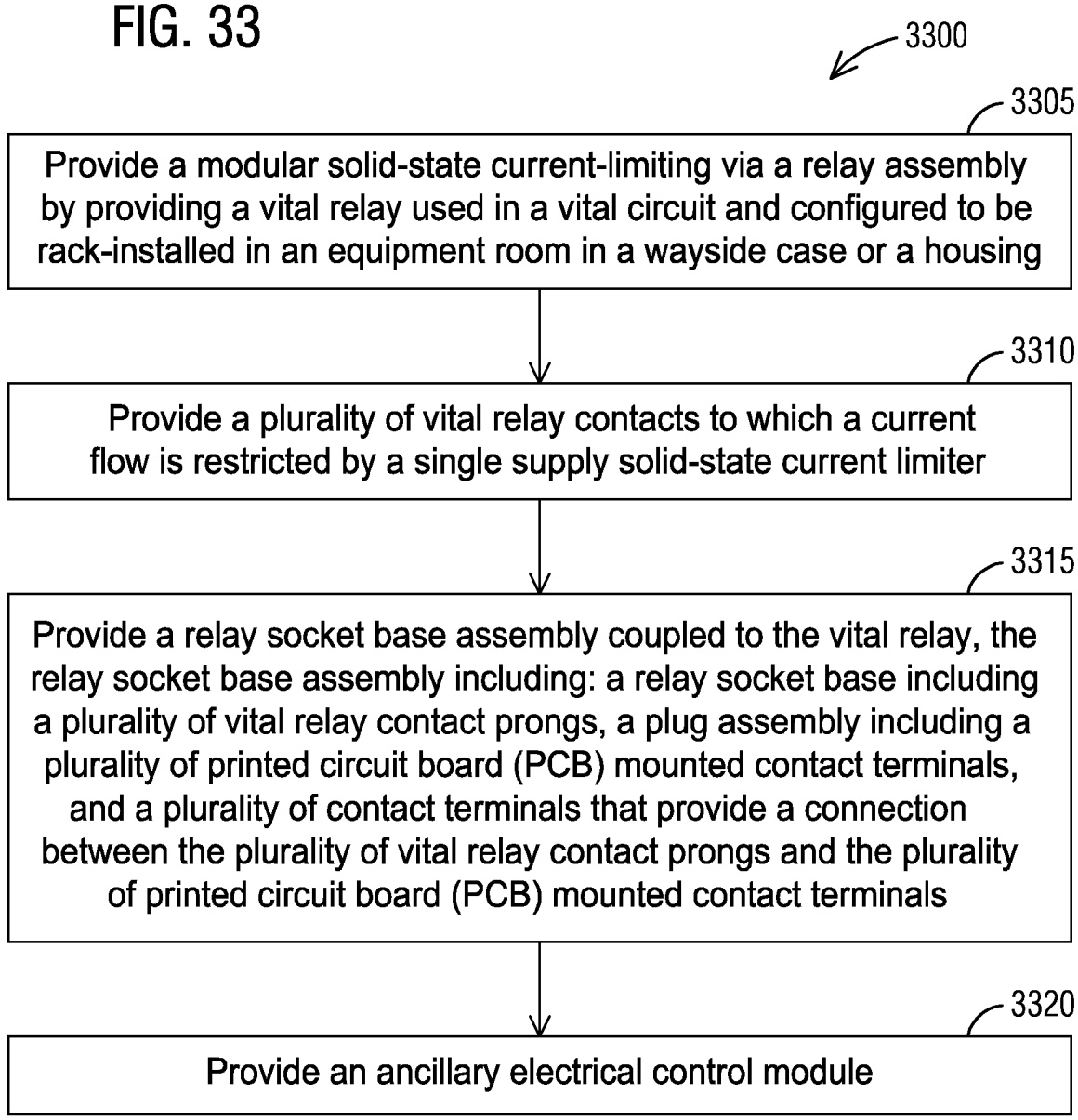

VITAL RELAY ASSEMBLY FOR MODULAR SOLID-STATE CURRENT-LIMITING

CROSS REFERENCE TO RELATED APPLICATIONS

This application claims priority from a provisional patent application of U.S. Ser. No. 62/685,441, filed Jun. 15, 2018, which is incorporated by reference herein in its entirety.

BACKGROUND

1. Field

Aspects of the present invention generally relate to a vital relay assembly for modular solid-state current-limiting.

2. Description of the Related Art

A relay-based signal system is used in vital systems for communication links. For example, vital relays are used in the signaling industry of railways. Vital relays are used in vital circuits and are rack-installed in equipment rooms and in wayside cases and housings. Some relays are energized by a DC voltage, others by an AC voltage. A vital relay is designed so that the probability of its failing to return to a prescribed state when it is de-energized is so low that for all practical purposes it is considered to be nonexistent. They are designed to meet the important requirements of safety, reliability, low maintenance and long operating life.

Vital relays plug onto plugboards. Relay contacts and coil(s) are brought out through a base of the relay as prongs. The plugboard may have wedge shaped plug insulators. There may be two terminals per insulator, one on each side. The terminals may be installed from behind the plugboard. When a vital relay is plugged in, two relay guide rods may align the vital relay so that all prongs properly align with their corresponding insulators. The prongs slide onto their respective plugboard terminals, thus making contact.

Destruction of vital relay contacts occurs due to being exposed to overcurrent condition. This destruction of vital relay contacts is currently occurring with the flasher relays being used in crossing designs with LED lamp units that are not properly protected from overcurrent. A secondary problem on these flasher relays is the back electromotive force (EMF) being produced by using a two-connection solid-state flasher module that doesn't have back EMF protections built in.

The overcurrent problem has been solved on other railroads up to now by providing wall mounted resistors to limit current. The main function of the resistors has been for voltage adjustment at the signal lamps, but the resistors happen to provide current limiting as well. Bi-directional TVS diodes are currently being proposed as a solution to the two-connection flasher module back EMF problem as a temporary solution. Other suppliers of vital flasher relays have solved the back EMF problems by using a three-connection flasher pack with back EMF protections built in. Regardless of number of connections, both styles of the flasher pack module are bolted on to the vital relay plugboard by use of a separate mounting bracket.

Therefore, there is a need for a design to restrict current flow to vital relay contacts with a smaller, less expensive relay house designs while still providing overcurrent protection for the vital relay contacts.

SUMMARY

Briefly described, aspects of the present invention relate to a single supply solid-state current limiter design to restrict current flow to the vital relay contacts. The back EMF issues caused by a two-connection flasher module are solved by providing a three-connection flasher module with built-in back EMF protection. A modular implementation of vital relay overcurrent protection allows for maximum flexibility in circuit designs. Reduced power consumption as compared to traditional passive overcurrent protection may be provided. Solid-state flasher modules that are easier to mount and provide the proper Back EMF protection circuits for vital relay coils are provided. Back EMF protection without the flasher circuits would also be possible using the same physical module housing. The smaller relay house designs would be accomplished by moving the overcurrent protection from the relay house walls and packaging the overcurrent circuits into modules that would utilize the unused space behind the rack-mounted vital relay plugboard. Packaging the overcurrent protection in modules that attach to a vital relay plugboard would provide the greatest level of flexibility to the relay house designers. A vital relay plugboard is designed to accept modular components while still fitting into the footprint of the current vital relay plugboard. A solid-state flasher is configured to drive a flasher relay coil with back EMF protection built in and in a modular format to allow mounting without an additional bracket to solve Back EMF induced electrical noise issues and flasher duty cycle issues while providing a cleaner mounting option for the flasher itself.

In accordance with one illustrative embodiment of the present invention, a relay assembly comprises a vital relay used in a vital circuit and configured to be rack-installed in an equipment room in a railroad case or a railroad housing. The relay assembly further comprises a plurality of vital relay contacts to which a current flow is restricted by a single supply solid-state current limiter. The relay assembly further comprises a relay socket base assembly coupled to the vital relay. The relay socket base assembly includes a relay socket base including a plurality of vital relay contact prongs, a plug assembly including a plurality of printed circuit board (PCB) mounted contact terminals, and a plurality of contact terminals that provide a connection between the plurality of vital relay contact prongs and the plurality of printed circuit board (PCB) mounted contact terminals. The relay assembly further comprises an ancillary electrical control module.

In accordance with another illustrative embodiment of the present invention, a method of providing a modular solid-state current-limiting via a relay assembly. The method comprises providing a vital relay used in a vital circuit and configured to be rack-installed in an equipment room in a railroad case or a railroad housing. The method further comprises providing a plurality of vital relay contacts to which a current flow is restricted by a single supply solid-state current limiter. The method further comprises providing a relay socket base assembly coupled to the vital relay. The relay socket base assembly includes a relay socket base including a plurality of vital relay contact prongs, a plug assembly including a plurality of printed circuit board (PCB) mounted contact terminals, and a plurality of contact terminals that provide a connection between the plurality of vital relay contact prongs and the plurality of printed circuit board (PCB) mounted contact terminals. The method further comprises providing an ancillary electrical control module.

BRIEF DESCRIPTION OF THE DRAWINGS

FIG. 17 illustrates an exploded view of a relay socket base assembly from back side in accordance with an exemplary embodiment of the present invention.

FIG. 33 illustrates a schematic view of a flow chart of a method of providing a modular solid-state current-limiting via a vital relay assembly in accordance with an exemplary embodiment of the present invention.

DETAILED DESCRIPTION

Figure 1:
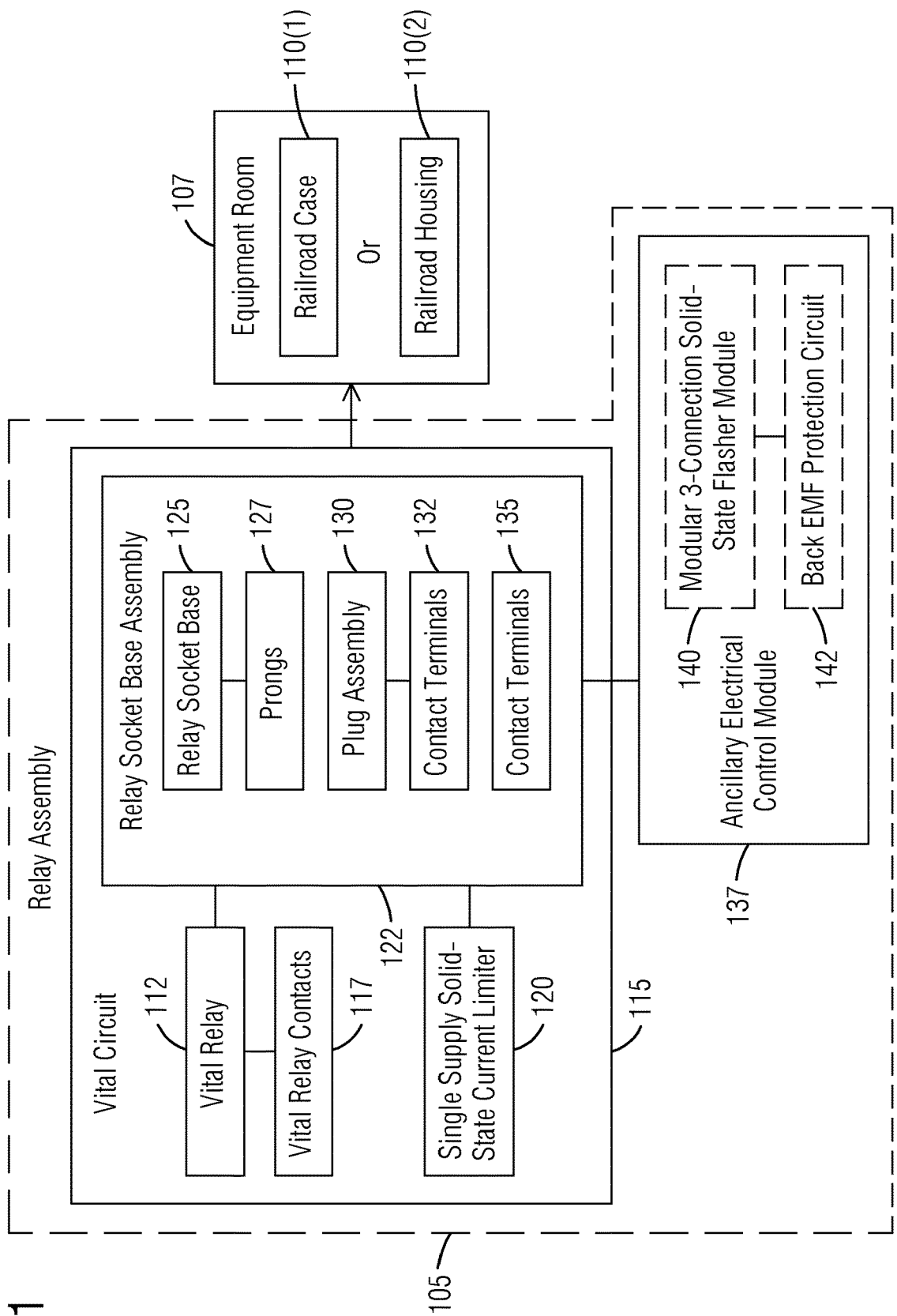
FIG. 1 illustrates a block diagram of a relay assembly to be installed in an equipment room in accordance with an exemplary embodiment of the present invention.

To facilitate an understanding of embodiments, principles, and features of the present invention, they are explained hereinafter with reference to implementation in illustrative embodiments. In particular, they are described in the context of a modular solid-state current-limiting provided by a vital relay assembly. The smaller relay house designs are accomplished by moving the overcurrent protection from the relay house walls and packaging the overcurrent circuits into modules that utilize the unused space behind a rack-mounted vital relay plugboard. Packaging the overcurrent protection in modules that attach to a vital relay plugboard provides the greatest level of flexibility to the relay house designers. A vital relay plugboard is designed to accept modular components while still fitting into the footprint of the current vital relay plugboard. A solid-state flasher is configured to drive a flasher relay coil with back EMF protection built in and in a modular format to allow mounting without an additional bracket. Embodiments of the present invention, however, are not limited to use in the described devices or methods.

The components and materials described hereinafter as making up the various embodiments are intended to be illustrative and not restrictive. Many suitable components and materials that would perform the same or a similar function as the materials described herein are intended to be embraced within the scope of embodiments of the present invention.

These and other embodiments of the vital relay assembly according to the present disclosure are described below with reference to FIGS. 1-33 herein. Like reference numerals used in the drawings identify similar or identical elements throughout the several views. The drawings are not necessarily drawn to scale.

Consistent with one embodiment of the present invention, FIG. 1 represents a block diagram of a relay assembly 105 in accordance with an exemplary embodiment of the present invention. The relay assembly 105 is to be installed in an equipment room 107 within a railroad case 110(1) or a railroad housing 110(2). The relay assembly 105 comprises a vital relay 112 used in a vital circuit 115 and configured to be rack-installed in the equipment room 107 in a wayside case or a housing. The relay assembly 105 further comprises a plurality of vital relay contacts 117 to which a current flow is restricted by a single supply solid-state current limiter 120.

The relay assembly 105 further comprises a relay socket base assembly 122 coupled to the vital relay 112. The relay socket base assembly 122 may include a relay socket base 125 including a plurality of vital relay contact prongs 127. The relay socket base assembly 122 may further include a plug assembly 130 including a plurality of printed circuit board (PCB) mounted contact terminals 132. The relay socket base assembly 122 may further include a plurality of contact terminals 135 that provide a connection between the plurality of vital relay contact prongs 127 and the plurality of printed circuit board (PCB) mounted contact terminals 132.

The relay assembly 105 further comprises an ancillary electrical control module 137. The relay assembly 105 further comprises an optional modular three-connection, solid-state flasher module 140 configured to mount without an additional bracket. The modular three-connection, solid-state flasher module 140 has built in a back electromotive force (EMF) protection circuit 142.

Figure 2:
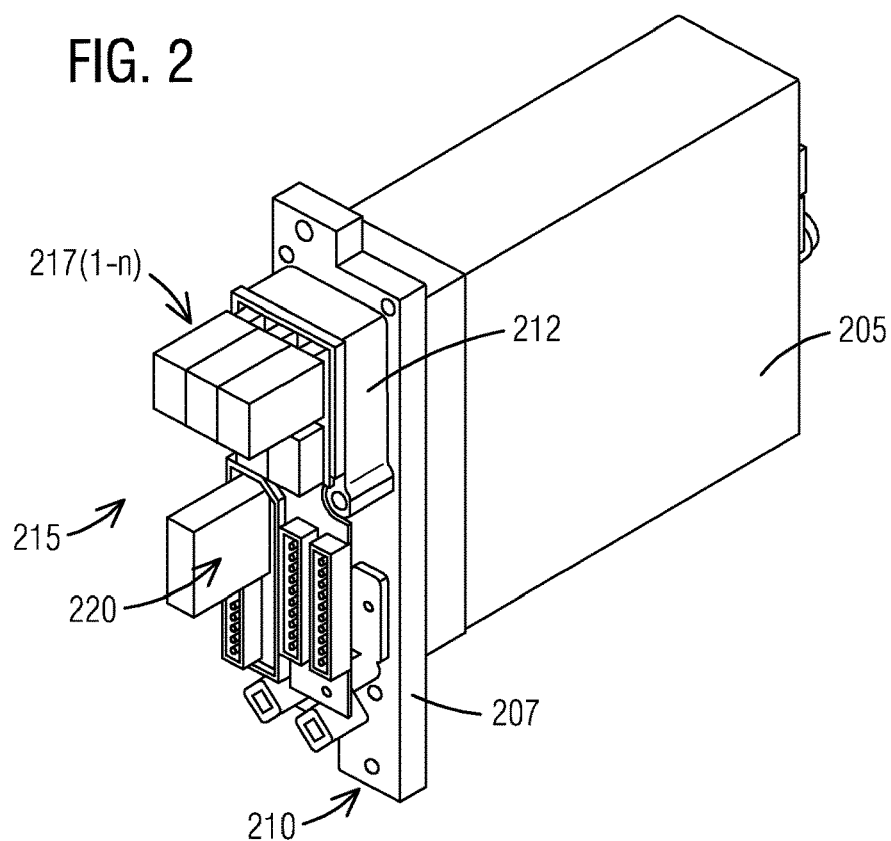
FIG. 2 illustrates a perspective view of a vital relay mounted on a plugboard from back in accordance with an exemplary embodiment of the present invention.

Referring to FIG. 2, it illustrates a perspective view of a vital relay 205 mounted on a plugboard 207 from back in accordance with an exemplary embodiment of the present invention. A relay socket base 210 includes the plugboard 207 and a contact terminal receptacle 212. A relay assembly 215 comprises one or more circuit protection modules 217 (1-n) that include overcurrent protection circuits (not seen). The relay assembly 215 further comprises a modular three-connection, solid-state flasher module 220.

Figure 3:
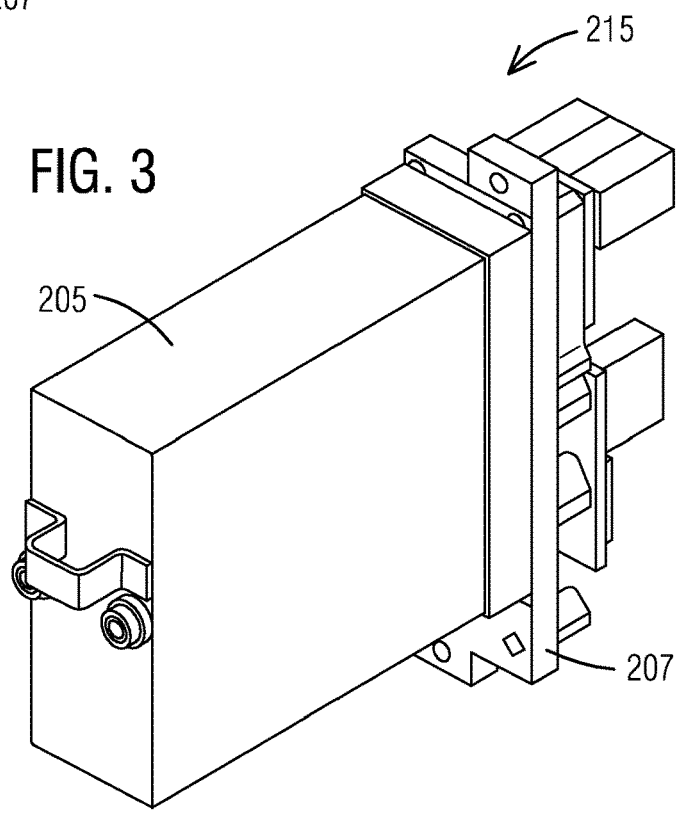
FIG. 3 illustrates a perspective view of a vital relay mounted on a plugboard from front in accordance with an exemplary embodiment of the present invention.
Figure 4:
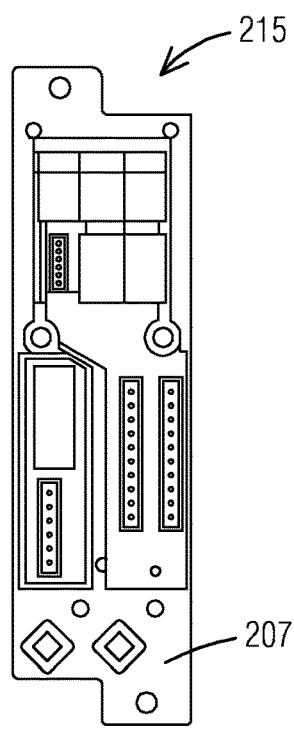
FIG. 4 illustrates a back view of a vital relay mounted on a plugboard in accordance with an exemplary embodiment of the present invention.

Turning now to FIG. 3, it illustrates a perspective view of the vital relay 205 mounted on the plugboard 207 from front in accordance with an exemplary embodiment of the present invention. FIG. 4 illustrates a back view of the vital relay 205 mounted on the plugboard 207 in accordance with an exemplary embodiment of the present invention.

Figure 5:
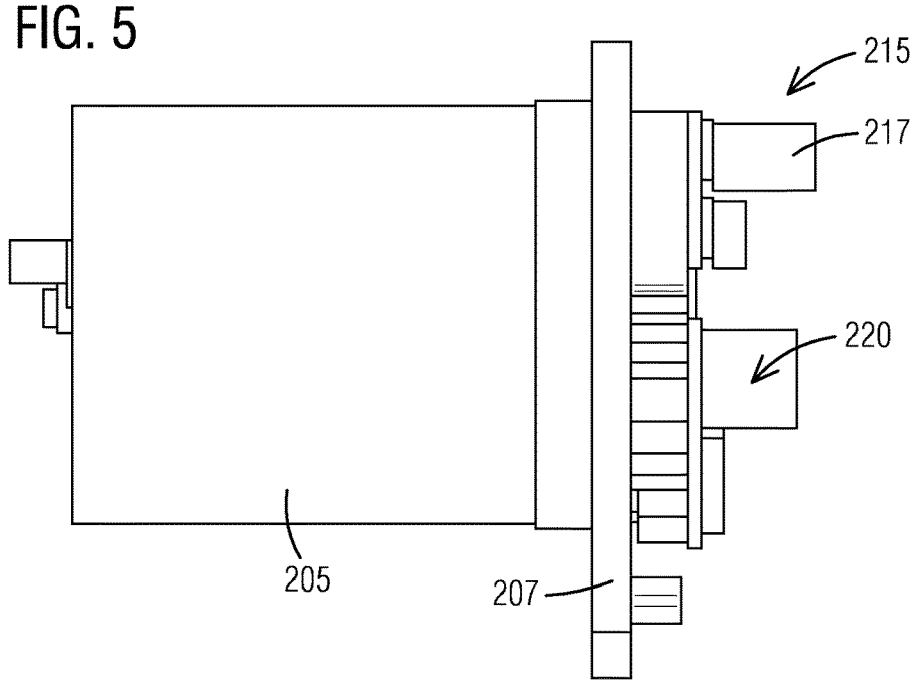
FIG. 5 illustrates a side view of a vital relay mounted on a plugboard in accordance with an exemplary embodiment of the present invention.
Figure 6:
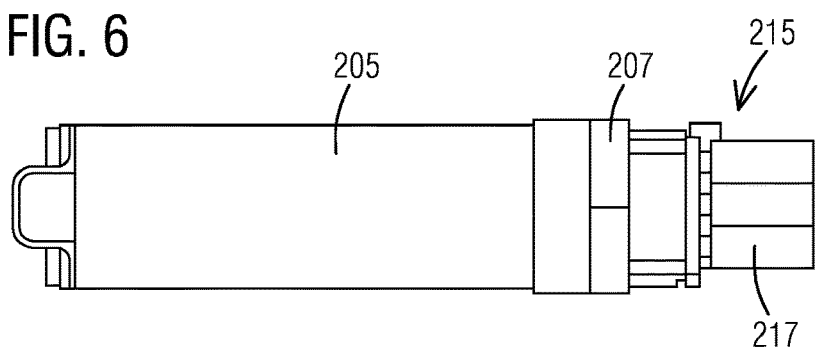
FIG. 6 illustrates a top view of a vital relay mounted on a plugboard in accordance with an exemplary embodiment of the present invention.
Figure 7:
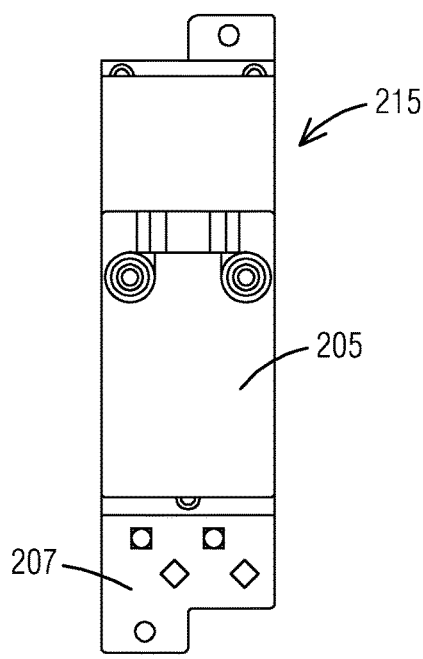
FIG. 7 illustrates a front view of a vital relay mounted on a plugboard in accordance with an exemplary embodiment of the present invention.

As seen in FIG. 5, it illustrates a side view of the vital relay 205 mounted on the plugboard 207 in accordance with an exemplary embodiment of the present invention. As shown in FIG. 6, it illustrates a top view of the vital relay 205 mounted on the plugboard 207 in accordance with an exemplary embodiment of the present invention. In FIG. 7, it illustrates a front view of the vital relay 205 mounted on the plugboard 207 in accordance with an exemplary embodiment of the present invention.

Figure 8:
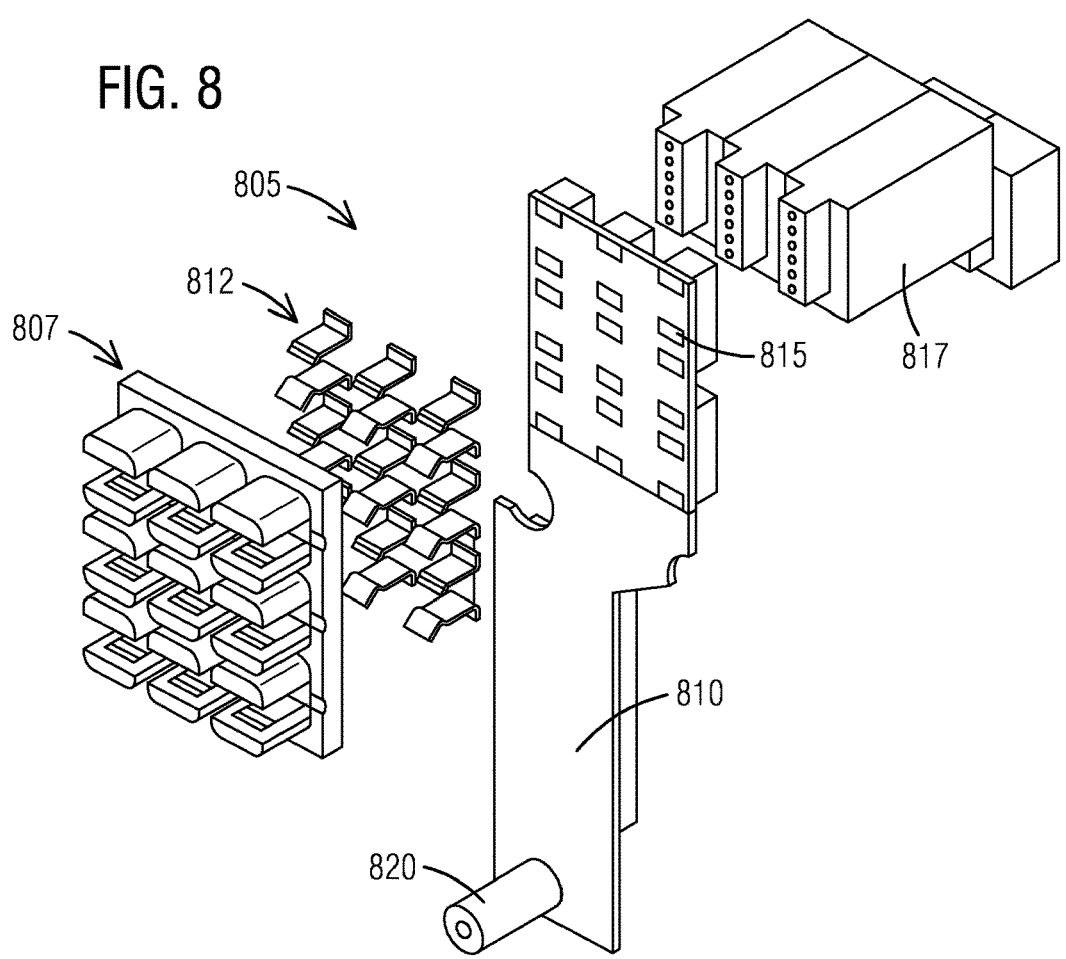
FIG. 8 illustrates an exploded view of a plug assembly from back side in accordance with an exemplary embodiment of the present invention.

With regard to FIG. 8, it illustrates an exploded view of a plug assembly 805 from back side in accordance with an exemplary embodiment of the present invention. The plug assembly 805 comprises a contact terminal insert 807, a board or a PCB 810 and a plurality of PCB mounted contact terminals 812 that are housed in the contact terminal insert 807. The PCB 810 has a plurality of terminal contact pads 815 to which the plurality of PCB mounted contact terminals 812 connect to on the PCB 810. The plug assembly 805 further comprises one or more circuit protection modules 817 including module circuits. The plurality of PCB mounted contact terminals 812 enables a connection to the module circuits of the one or more circuit protection modules 817. The PCB 810 includes a wire trace (not shown) that provides a landing point for external wiring and connects that wiring to the module circuits of the one or more circuit protection modules 817. The plug assembly 805 also includes one or more printed circuit board (PCB) connectors (not seen) for relay contacts. The plug assembly 805 further comprises a stand off 820.

Figure 9:
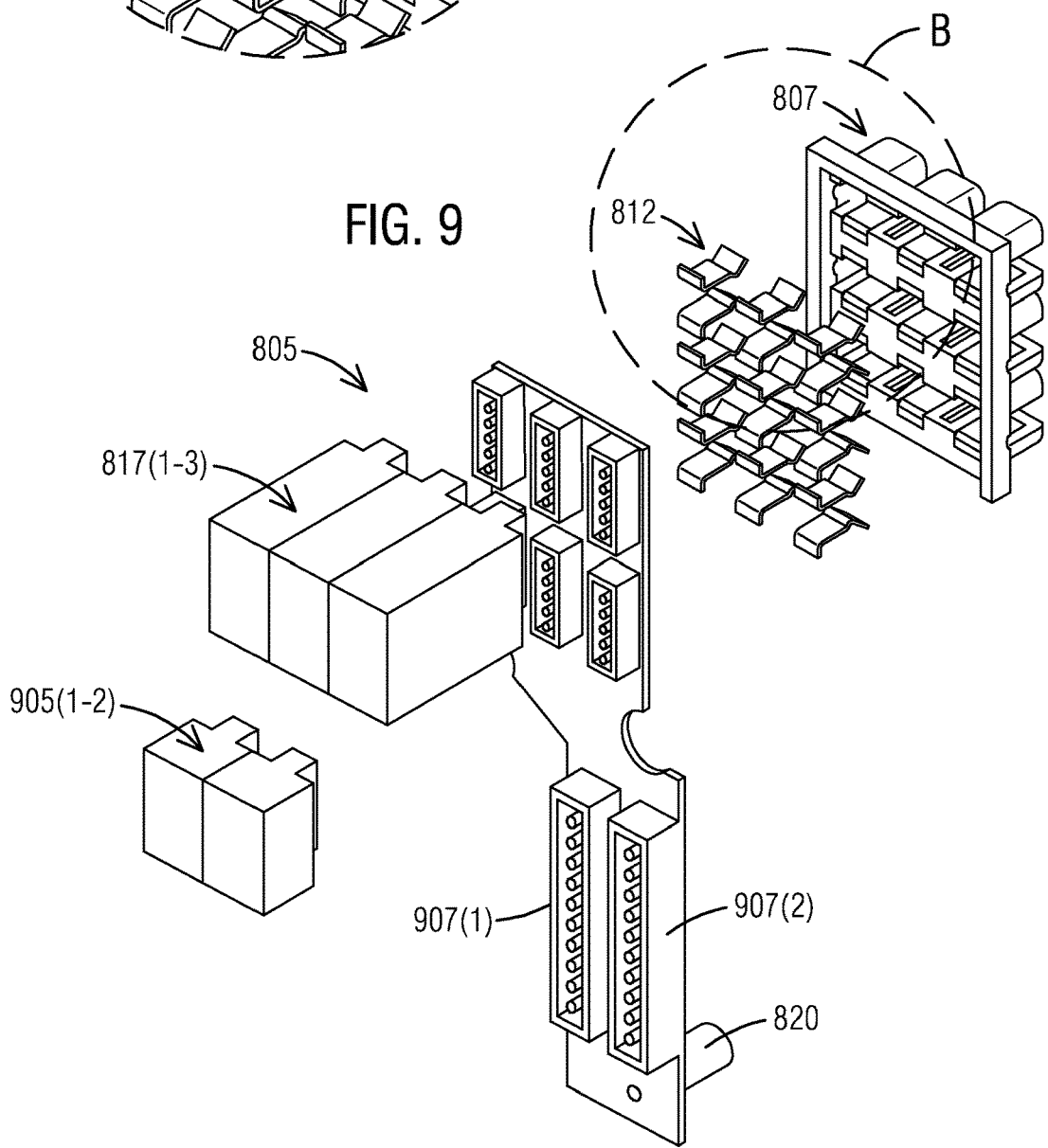
FIG. 9 illustrates an exploded view of a plug assembly from front side in accordance with an exemplary embodiment of the present invention.

With respect to FIG. 9, it illustrates an exploded view of the plug assembly 805 from front side in accordance with an exemplary embodiment of the present invention. The plug assembly 805 further comprises three circuit protection modules 817 (1-3) and two jumper modules 905(1-2). The plug assembly 805 also includes two printed circuit board (PCB) connectors 907(1-2) for relay contacts. The printed circuit board (PCB) connectors 907(1-2) may comprise 2-10 pins.

Figure 12:
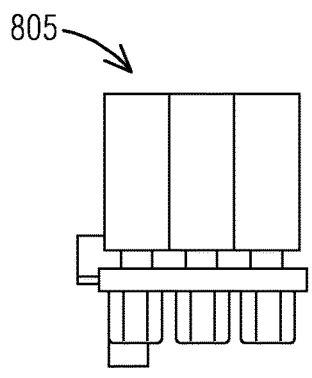
FIG. 12 illustrates a top view of the assembled plug assembly of FIG. 8 in accordance with an exemplary embodiment of the present invention.
Figure 11:
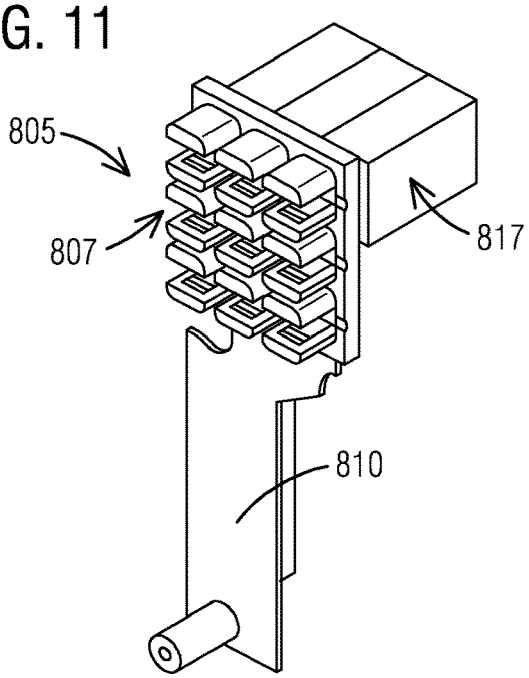
FIG. 11 illustrates an assembled view of the plug assembly of FIG. 8 in accordance with an exemplary embodiment of the present invention.
Figure 10:
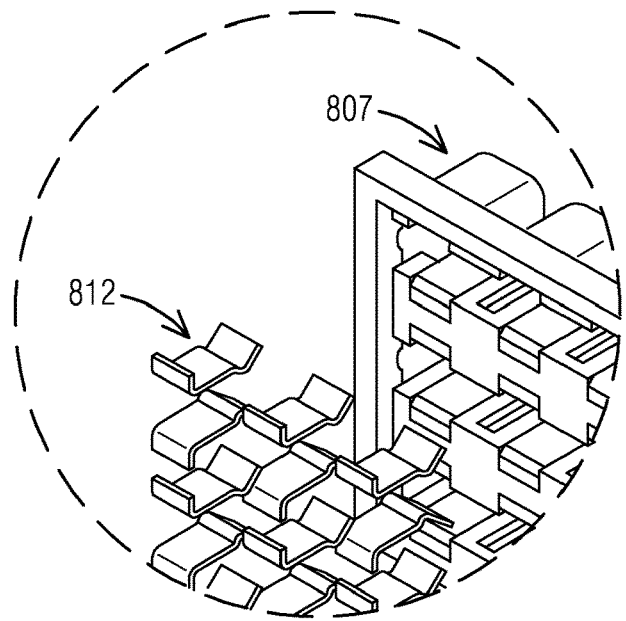
FIG. 10 illustrates a view of a detail B from FIG. 9 of the plug assembly in accordance with an exemplary embodiment of the present invention.
Figure 13:
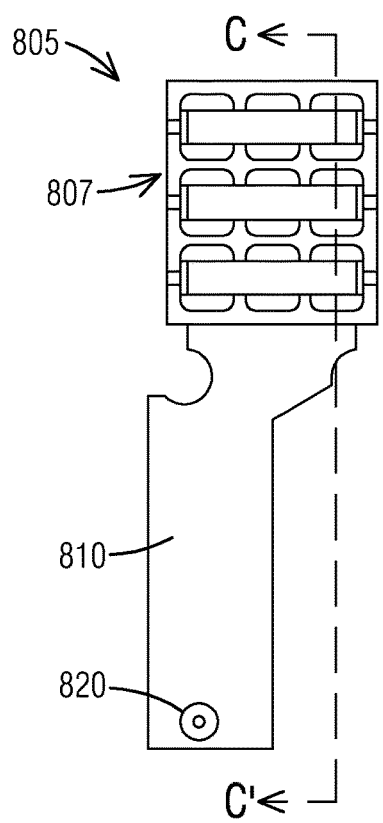
FIG. 13 illustrates a back view of the assembled plug assembly of FIG. 8 in accordance with an exemplary embodiment of the present invention.
Figure 14:
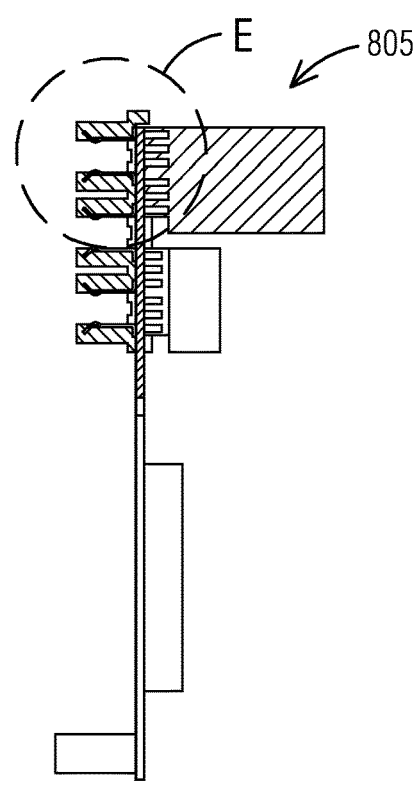
FIG. 14 illustrates a cross-sectional view of the assembled plug assembly of FIG. 13 at a line C-C' in accordance with an exemplary embodiment of the present invention.

FIG. 10 illustrates a view of a detail B from FIG. 9 of the plug assembly 805 in accordance with an exemplary embodiment of the present invention. FIG. 11 illustrates an assembled view of the plug assembly 805 of FIG. 8 in accordance with an exemplary embodiment of the present invention. FIG. 12 illustrates a top view of the assembled plug assembly 805 of FIG. 8 in accordance with an exemplary embodiment of the present invention. FIG. 13 illustrates a back view of the assembled plug assembly 805 of FIG. 8 in accordance with an exemplary embodiment of the present invention. FIG. 14 illustrates a cross-sectional view of the assembled plug assembly 805 of FIG. 13 at a line C-C' in accordance with an exemplary embodiment of the present invention.

Figure 15:
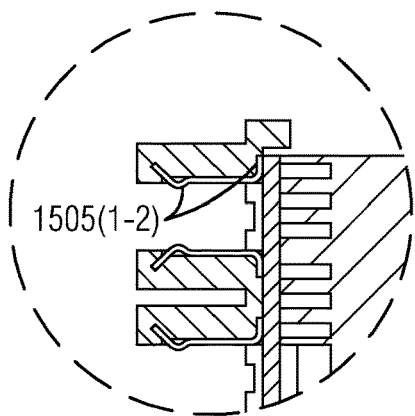
FIG. 15 illustrates a view of a detail E from FIG. 14 of the plug assembly in accordance with an exemplary embodiment of the present invention.

FIG. 15 illustrates a view of a detail E from FIG. 14 of the plug assembly 805 in accordance with an exemplary embodiment of the present invention. The plug assembly 805 includes electrical connection points 1505(1-2).

Figure 16:
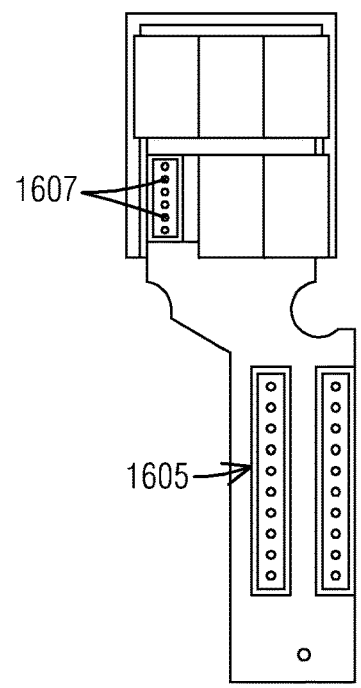
FIG. 16 illustrates a front view of the assembled plug assembly of FIG. 8 in accordance with an exemplary embodiment of the present invention.

FIG. 16 illustrates a front view of the assembled plug assembly 805 of FIG. 8 in accordance with an exemplary embodiment of the present invention. One module is removed for clarity and the connectors 1605 for relay contacts are seen along with board traces 1607.

FIG. 17 illustrates an exploded view of a relay socket base assembly 1705 from back side in accordance with an exemplary embodiment of the present invention. The relay socket base assembly 1705 may be coupled to a vital relay (not shown). The relay socket base assembly 1705 includes a relay socket base 1707 including a plurality of vital relay contact prongs 1710. The relay socket base assembly 1705 further includes a plug assembly 1712 including a plurality of printed circuit board (PCB) mounted contact terminals 812 (not seen). The relay socket base assembly 1705 further includes a plurality of contact terminals 1715(1-k) that provide a connection between the plurality of vital relay contact prongs 1710 and the plurality of printed circuit board (PCB) mounted contact terminals 812. The relay socket base assembly 1705 further includes an ancillary electrical control module 1717 such as a flasher pack module.

The relay socket base 1707 includes a plugboard 1720 and a contact terminal receptacle 1722. The plurality of contact terminals 1715 may be made of a conductive metal. The relay socket base 1707 further includes a wedge-shaped plurality of insulators 1725(1-m) that separates the plurality of contact terminals 1715, wedges the plurality of contact terminals 1715 against the plurality of vital relay contact prongs 1710 and secures the contact terminal receptacle 1722 to the plugboard 1720 of the relay socket base 1707.

The plurality of contact terminals 1715 may be configured as flexible springs capable of making an electrical connection between two contact terminals. Each contact terminal 1715 is shaped in an elongated flexible spring body 1732 which has a bend 1735 on a first end and two free ends 1737(1-2) of a second end. The elongated flexible spring body 1732 has two slots 1740 (1-2) facing each other.

The relay socket base assembly 1705 further comprises an optional modular three-connection, solid-state flasher module such as the module 1717 which has built in a back electromotive force (EMF) protection circuit (not seen). The relay socket base assembly 1705 further comprises a plurality of circuit protection modules 1750(1-$j$) that include overcurrent protection circuits (not seen). For example, at least one circuit protection module 1750 may be mounted on the plug assembly 1712 and at least one jumper module 1755 may be mounted on the plug assembly 1712.

Figure 18:
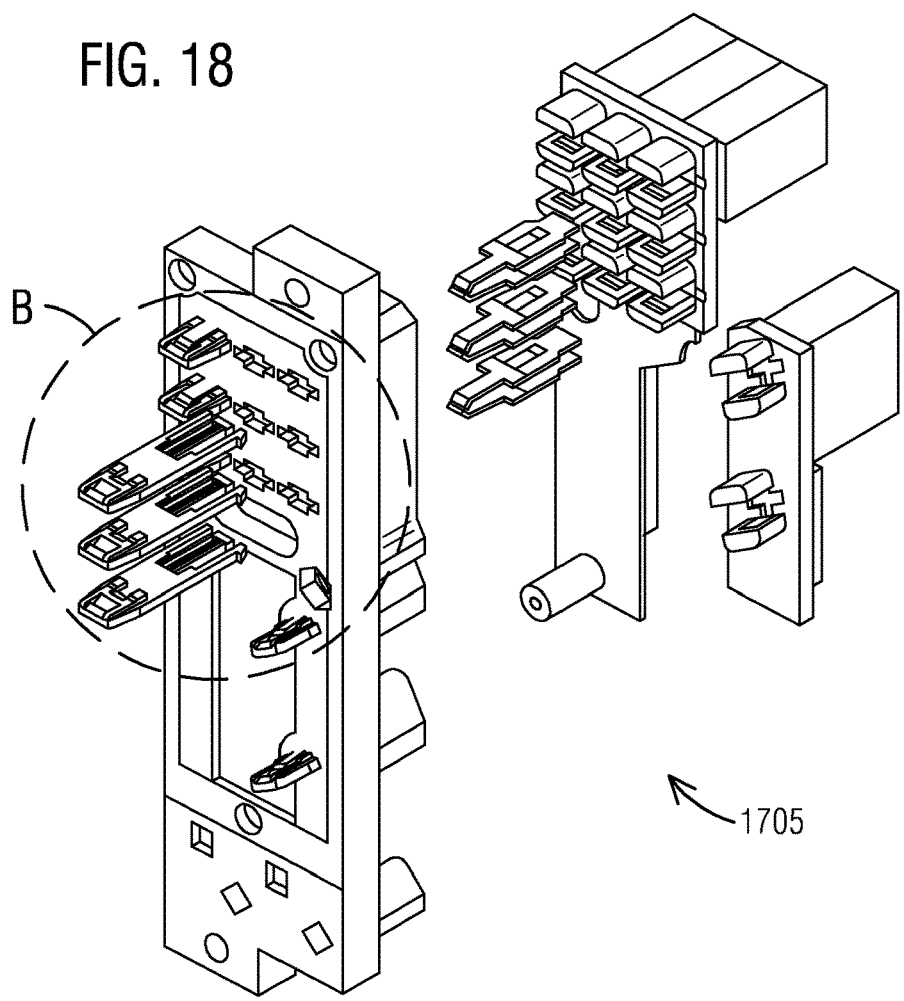
FIG. 18 illustrates an exploded view of a relay socket base assembly from front side in accordance with an exemplary embodiment of the present invention.
Figure 19:
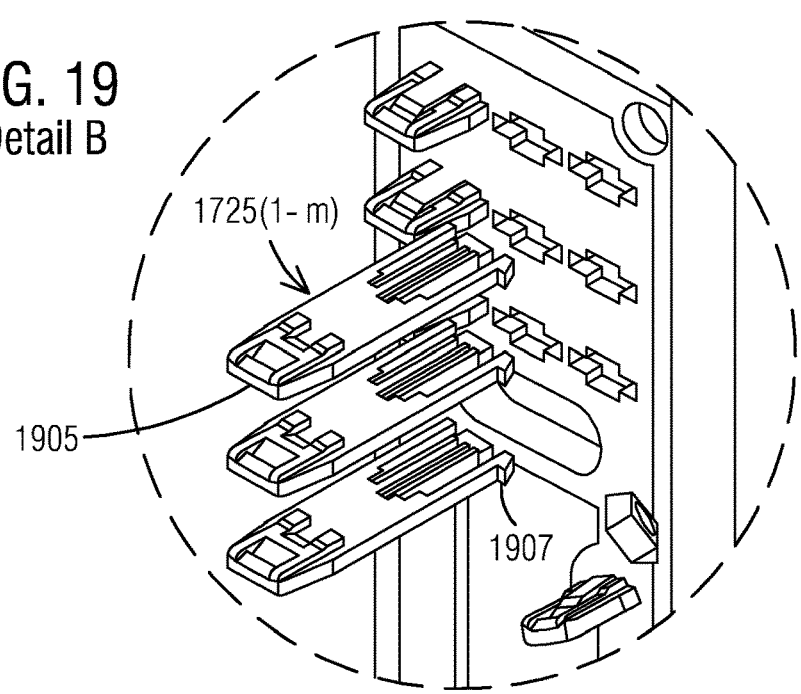
FIG. 19 illustrates a view of a detail B from FIG. 18 of the relay socket base assembly in accordance with an exemplary embodiment of the present invention.

FIG. 18 illustrates an exploded view of the relay socket base assembly 1705 from front side in accordance with an exemplary embodiment of the present invention. FIG. 19 illustrates a view of a detail B from FIG. 18 of the relay socket base assembly 1705 in accordance with an exemplary embodiment of the present invention. Each insulator 1725 of the plurality of insulators 1725(1-$m$) comprise a socket insert terminal holder 1905 and a snap lock feature 1907.

Figure 20:
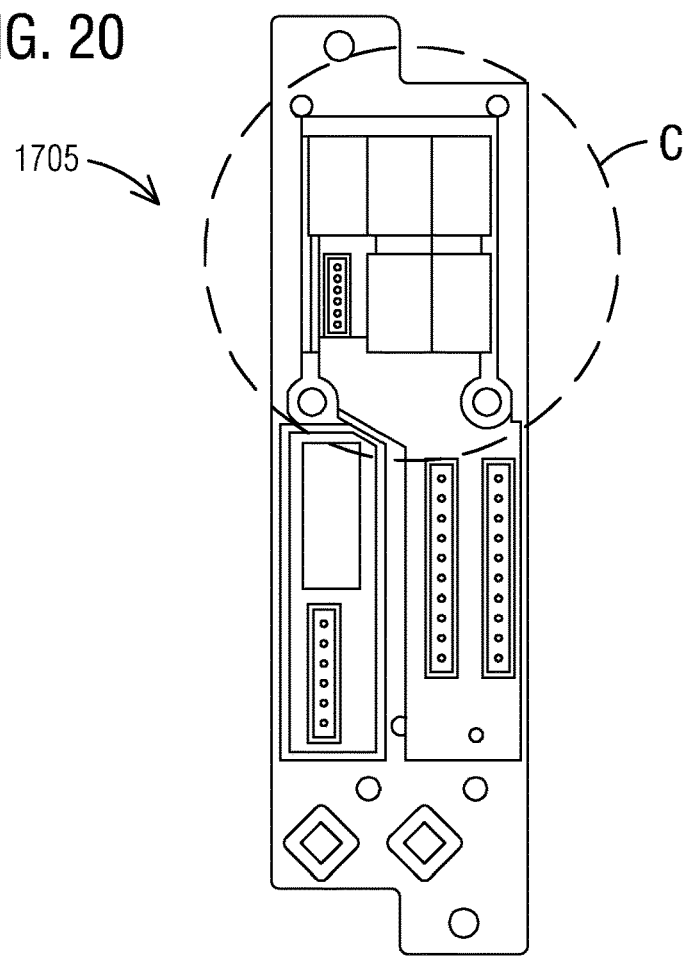
FIG. 20 illustrates a back view of a relay socket base assembly in accordance with an exemplary embodiment of the present invention.
Figure 21:
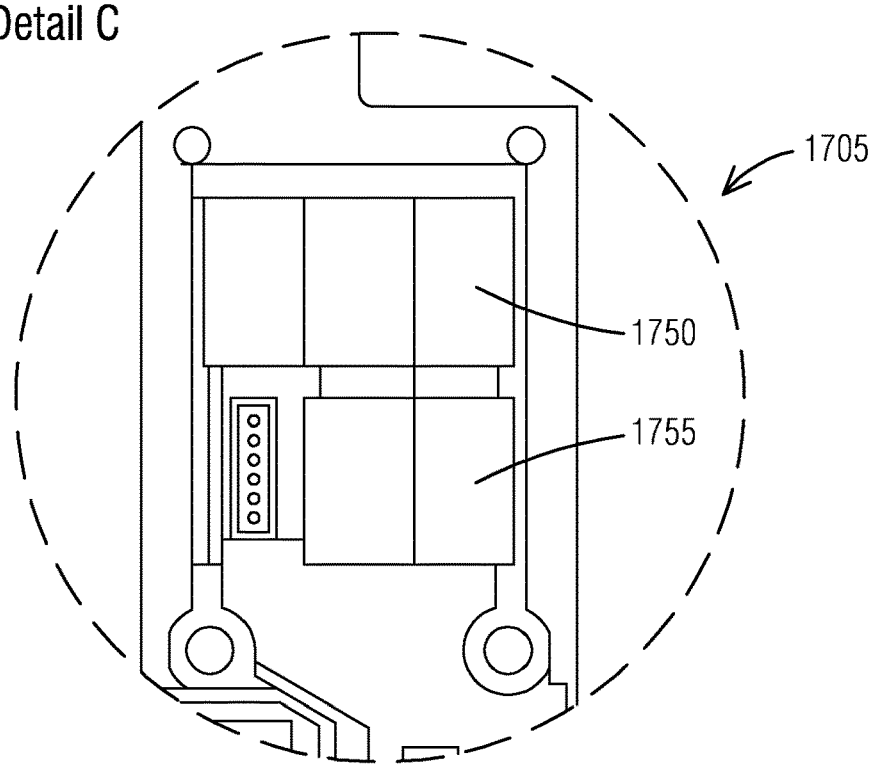
FIG. 21 illustrates a view of a detail C from FIG. 20 of the relay socket base assembly in accordance with an exemplary embodiment of the present invention.

FIG. 20 illustrates a back view of the relay socket base assembly 1705 in accordance with an exemplary embodiment of the present invention. FIG. 21 illustrates a view of a detail C from FIG. 20 of the relay socket base assembly 1705 in accordance with an exemplary embodiment of the present invention.

Figure 22:
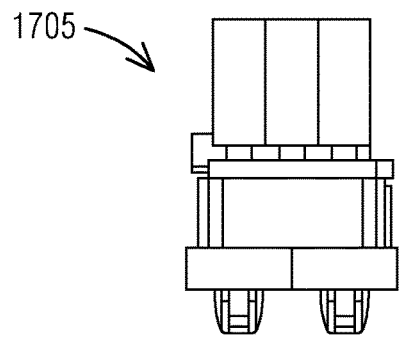
FIG. 22 illustrates a top view of a relay socket base assembly in accordance with an exemplary embodiment of the present invention.
Figure 23:
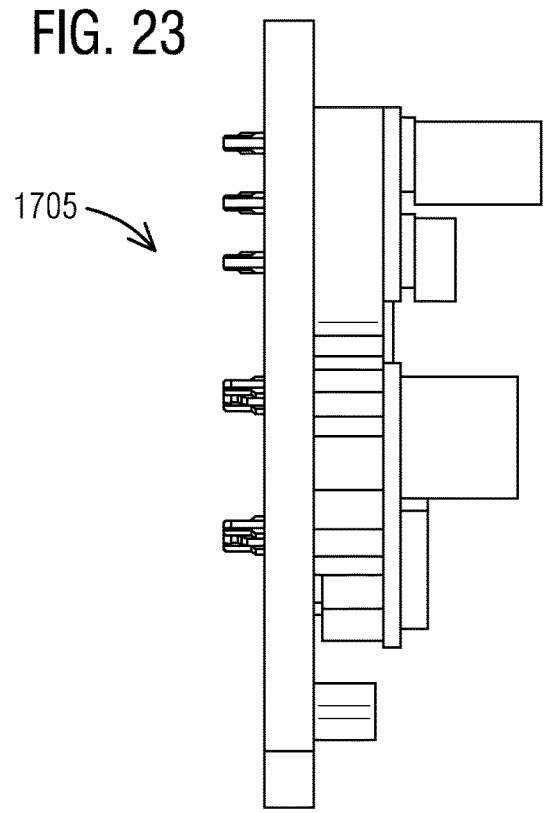
FIG. 23 illustrates a side view of a relay socket base assembly in accordance with an exemplary embodiment of the present invention.
Figure 24:
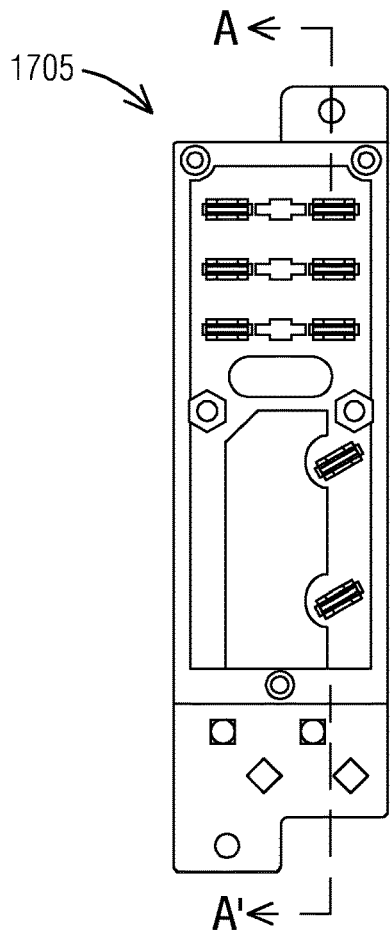
FIG. 24 illustrates a front view of a relay socket base assembly in accordance with an exemplary embodiment of the present invention.
Figure 25:
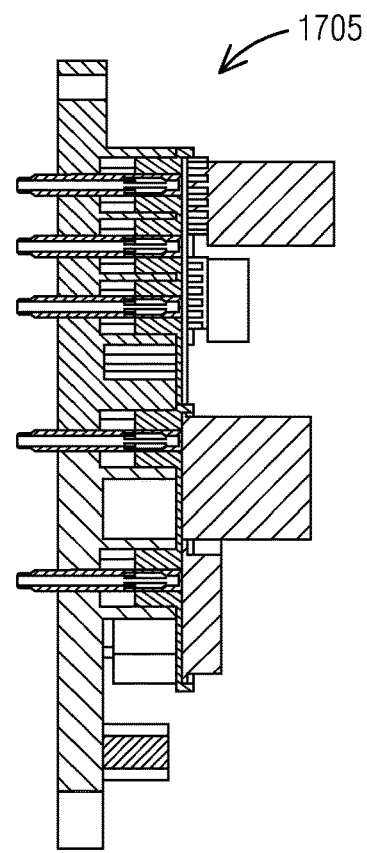
FIG. 25 illustrates a cross-sectional view of the assembled relay socket base assembly of FIG. 24 at a line A-A' in accordance with an exemplary embodiment of the present invention.

FIG. 22 illustrates a top view of the relay socket base assembly 1705 in accordance with an exemplary embodiment of the present invention. FIG. 23 illustrates a side view of the relay socket base assembly 1705 in accordance with an exemplary embodiment of the present invention. FIG. 24 illustrates a front view of the relay socket base assembly 1705 in accordance with an exemplary embodiment of the present invention. FIG. 25 illustrates a cross-sectional view of the assembled relay socket base assembly 1705 of FIG. 24 at a line A-A' in accordance with an exemplary embodiment of the present invention.

Figure 26:
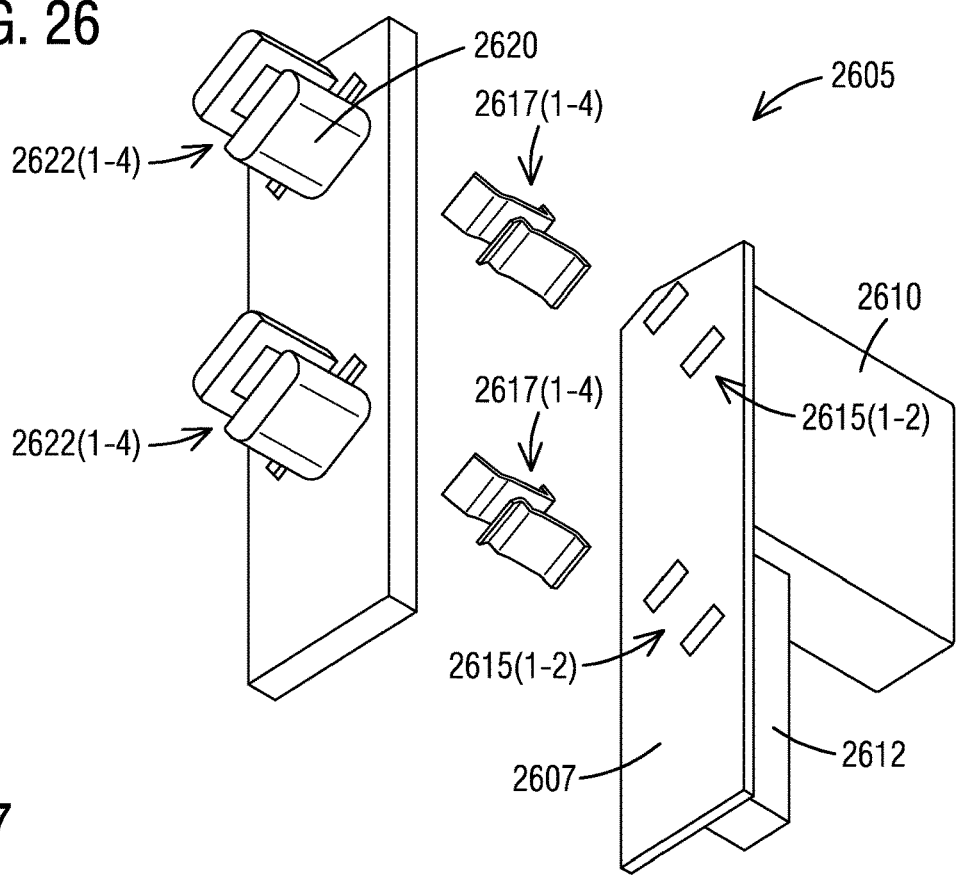
FIG. 26 illustrates an exploded view of a plug-in flasher pack assembly from back side in accordance with an exemplary embodiment of the present invention.

FIG. 26 illustrates an exploded view of a plug-in flasher pack assembly 2605 from back side in accordance with an exemplary embodiment of the present invention. The plug-in flasher pack assembly 2605 comprises a printed circuit board (PCB) 2607 with a flasher pack 2610 and a 6-pin connector 2612 mounted on a front side of the PCB 2607. On a back side of the PCB 2607, two pairs of PCB contact pads 2615(1-2) are provided. The plug-in flasher pack assembly 2605 comprises a plurality of spring contacts 2617(1-4) and a molded flasher socket 2620. The molded flasher socket 2620 comprises a plurality of inserts 2622(1-4) to receive the plurality of spring contacts 2617(1-4). The plurality of spring contacts 2617(1-4) enables a connection to the plug-in flasher pack assembly 2605 when mounted on the plugboard 1720 of the relay socket base 1707.

Figure 27:
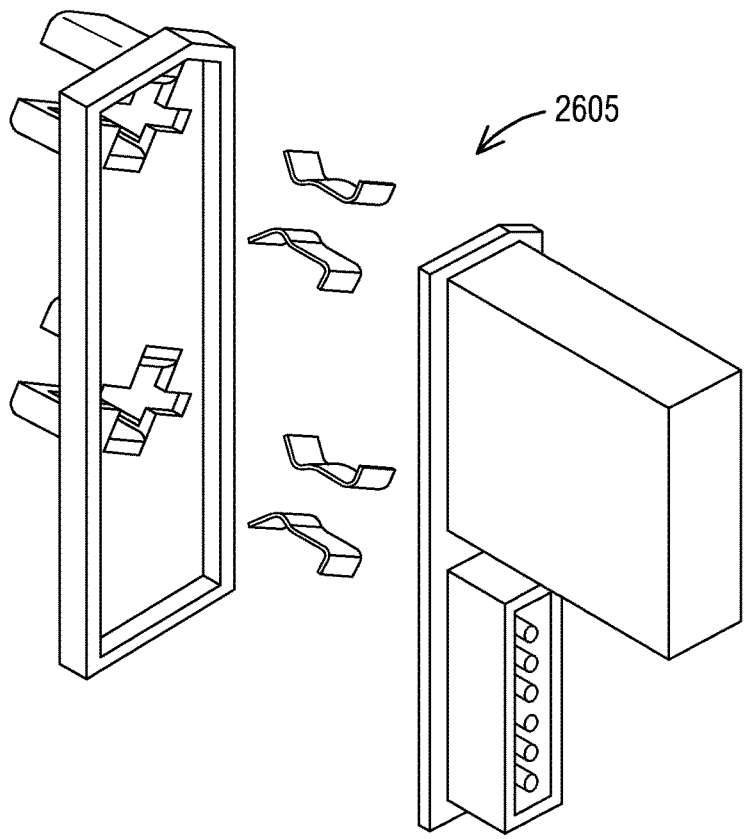
FIG. 27 illustrates an exploded view of a plug-in flasher pack assembly from front side in accordance with an exemplary embodiment of the present invention.
Figure 28:
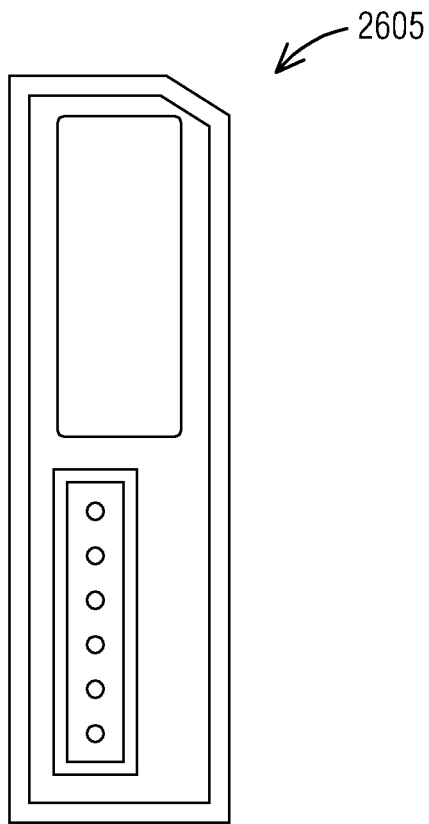
FIG. 28 illustrates a front view of a plug-in flasher pack assembly in accordance with an exemplary embodiment of the present invention.
Figure 29:
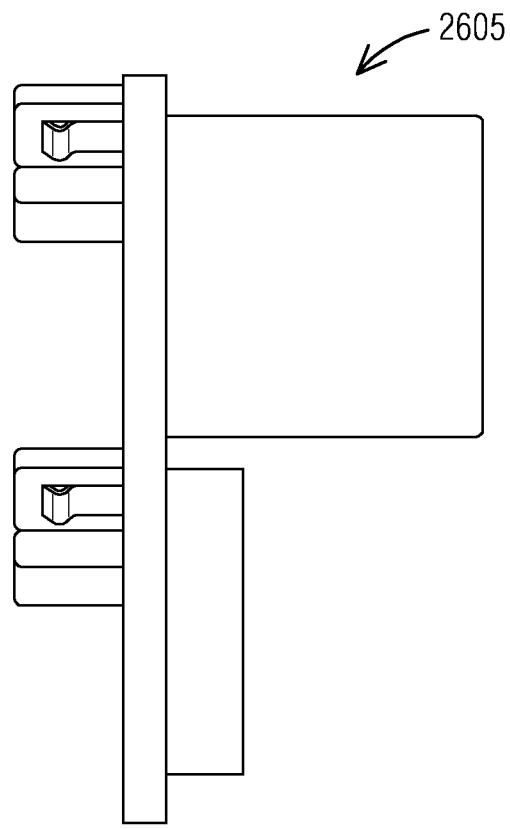
FIG. 29 illustrates a side view of a plug-in flasher pack assembly in accordance with an exemplary embodiment of the present invention.
Figure 30:
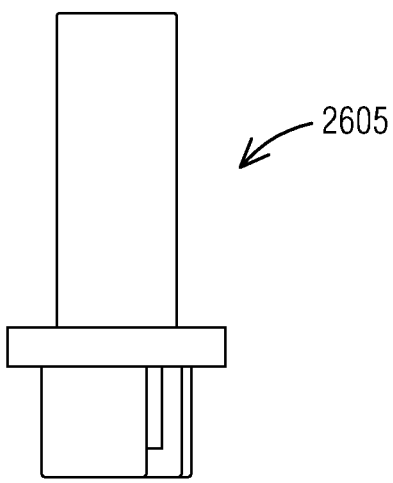
FIG. 30 illustrates a top view of a plug-in flasher pack assembly in accordance with an exemplary embodiment of the present invention.
Figure 31:
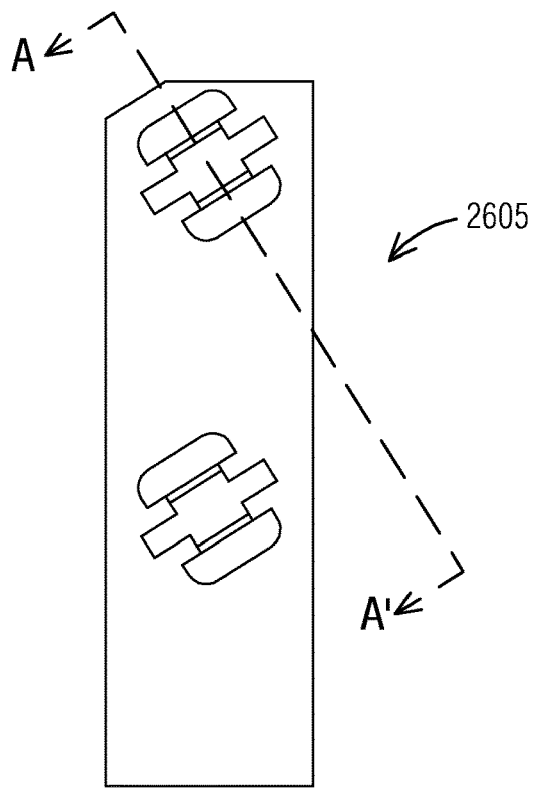
FIG. 31 illustrates a back view of a plug-in flasher pack assembly in accordance with an exemplary embodiment of the present invention.

FIG. 27 illustrates an exploded view of the plug-in flasher pack assembly 2605 from front side in accordance with an exemplary embodiment of the present invention. FIG. 28 illustrates a front view of the plug-in flasher pack assembly 2605 in accordance with an exemplary embodiment of the present invention. FIG. 29 illustrates a side view of the plug-in flasher pack assembly 2605 in accordance with an exemplary embodiment of the present invention. FIG. 30 illustrates a top view of the plug-in flasher pack assembly 2605 in accordance with an exemplary embodiment of the present invention. FIG. 31 illustrates a back view of the plug-in flasher pack assembly 2605 in accordance with an exemplary embodiment of the present invention.

Figure 32:
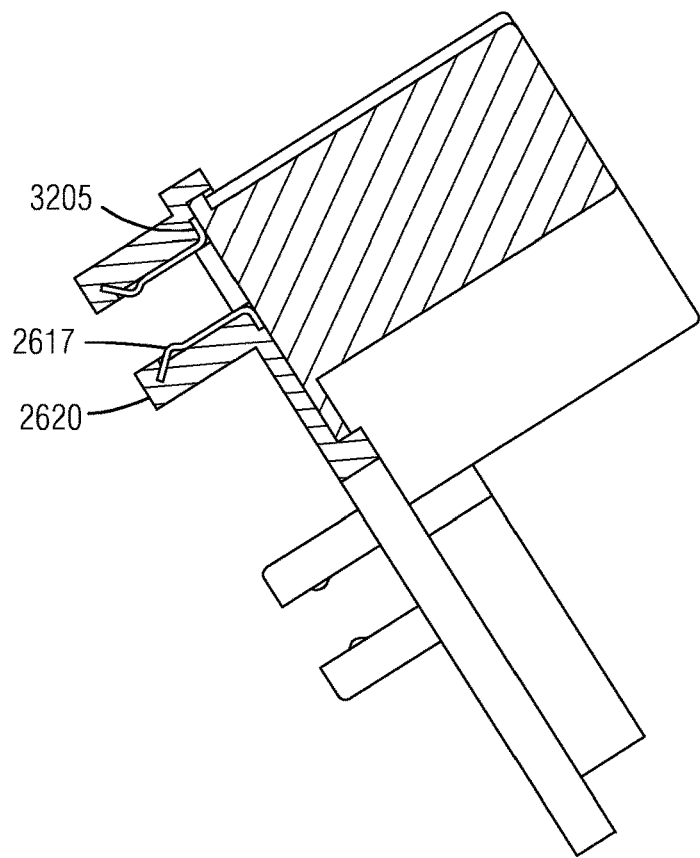
FIG. 32 illustrates a cross-sectional view of the assembled plug-in flasher pack assembly of FIG. 31 at a line A-A' in accordance with an exemplary embodiment of the present invention.

FIG. 32 illustrates a cross-sectional view of the assembled plug-in flasher pack assembly 2605 of FIG. 31 at a line A-A' in accordance with an exemplary embodiment of the present invention. The plurality of spring contacts 2617(1-4) enables a connection 3205 to the plug-in flasher pack assembly 2605 when mounted on the plugboard 1720 of the relay socket base 1707.

FIG. 33 illustrates a schematic view of a flow chart of a method 3300 of providing a modular solid-state current-limiting via the relay assembly 105 in accordance with an exemplary embodiment of the present invention. Reference is made to the elements and features described in FIGS. 1-32. It should be appreciated that some steps are not required to be performed in any particular order, and that some steps are optional.

The method 3300 in step 3305 provides a vital relay used in a vital circuit and configured to be rack-installed in an equipment room in a wayside case or a housing. The method 3300 in step 3310 further provides a plurality of vital relay contacts to which a current flow is restricted by a single supply solid-state current limiter. The method 3300 in step 3315 further provides a relay socket base assembly coupled to the vital relay. The relay socket base assembly includes a relay socket base including a plurality of vital relay contact prongs, a plug assembly including a plurality of printed circuit board (PCB) mounted contact terminals, and a plurality of contact terminals that provide a connection between the plurality of vital relay contact prongs and the plurality of printed circuit board (PCB) mounted contact terminals. The method 3300 in step 3320 further provides an ancillary electrical control module.

While a modular solid-state current-limiting is described here a range of one or more other circuit functionality or other forms of control are also contemplated by the present invention. For example, other types of circuit protection or monitoring control may be implemented based on one or more features presented above without deviating from the spirit of the present invention.

The techniques described herein can be particularly useful for vital flasher relays that have solved the back EMF problems by using a three-connection, solid-state flasher pack with back EMF protections built in. In flasher relays, the back electromotive force (EMF) gets produced when using a two-connection solid-state flasher module that doesn't have back EMF protections built in. While particular embodiments are described in terms of a three-connection, solid-state flasher pack that includes back EMF protections built in, the techniques described herein are not limited to such a three-connection module but can also be used with other electrical structures or configurations.

While embodiments of the present invention have been disclosed in exemplary forms, it will be apparent to those skilled in the art that many modifications, additions, and deletions can be made therein without departing from the spirit and scope of the invention and its equivalents, as set forth in the following claims.

Embodiments and the various features and advantageous details thereof are explained more fully with reference to the non-limiting embodiments that are illustrated in the accompanying drawings and detailed in the following description. Descriptions of well-known starting materials, processing techniques, components and equipment are omitted so as not to unnecessarily obscure embodiments in detail. It should be understood, however, that the detailed description and the specific examples, while indicating preferred embodiments, are given by way of illustration only and not by way of limitation. Various substitutions, modifications, additions and/or rearrangements within the spirit and/or scope of the underlying inventive concept will become apparent to those skilled in the art from this disclosure.

As used herein, the terms "comprises," "comprising," "includes," "including," "has," "having" or any other variation thereof, are intended to cover a non-exclusive inclusion. For example, a process, article, or apparatus that comprises a list of elements is not necessarily limited to only those elements but may include other elements not expressly listed or inherent to such process, article, or apparatus.

Additionally, any examples or illustrations given herein are not to be regarded in any way as restrictions on, limits to, or express definitions of, any term or terms with which they are utilized. Instead, these examples or illustrations are to be regarded as being described with respect to one particular embodiment and as illustrative only. Those of ordinary skill in the art will appreciate that any term or terms with which these examples or illustrations are utilized will encompass other embodiments which may or may not be given therewith or elsewhere in the specification and all such embodiments are intended to be included within the scope of that term or terms.

In the foregoing specification, the invention has been described with reference to specific embodiments. However, one of ordinary skill in the art appreciates that various modifications and changes can be made without departing from the scope of the invention. Accordingly, the specification and figures are to be regarded in an illustrative rather than a restrictive sense, and all such modifications are intended to be included within the scope of invention.

Although the invention has been described with respect to specific embodiments thereof, these embodiments are merely illustrative, and not restrictive of the invention. The description herein of illustrated embodiments of the invention is not intended to be exhaustive or to limit the invention to the precise forms disclosed herein (and in particular, the inclusion of any particular embodiment, feature or function is not intended to limit the scope of the invention to such embodiment, feature or function). Rather, the description is intended to describe illustrative embodiments, features and functions in order to provide a person of ordinary skill in the art context to understand the invention without limiting the invention to any particularly described embodiment, feature or function. While specific embodiments of, and examples for, the invention are described herein for illustrative purposes only, various equivalent modifications are possible within the spirit and scope of the invention, as those skilled in the relevant art will recognize and appreciate. As indicated, these modifications may be made to the invention in light of the foregoing description of illustrated embodiments of the invention and are to be included within the spirit and scope of the invention. Thus, while the invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the invention.

Respective appearances of the phrases "in one embodiment," "in an embodiment," or "in a specific embodiment" or similar terminology in various places throughout this specification are not necessarily referring to the same embodiment. Furthermore, the particular features, structures, or characteristics of any particular embodiment may be combined in any suitable manner with one or more other embodiments. It is to be understood that other variations and modifications of the embodiments described and illustrated herein are possible in light of the teachings herein and are to be considered as part of the spirit and scope of the invention.

In the description herein, numerous specific details are provided, such as examples of components and/or methods, to provide a thorough understanding of embodiments of the invention. One skilled in the relevant art will recognize, however, that an embodiment may be able to be practiced without one or more of the specific details, or with other apparatus, systems, assemblies, methods, components, materials, parts, and/or the like. In other instances, well-known structures, components, systems, materials, or operations are not specifically shown or described in detail to avoid obscuring aspects of embodiments of the invention. While the invention may be illustrated by using a particular embodiment, this is not and does not limit the invention to any particular embodiment and a person of ordinary skill in the art will recognize that additional embodiments are readily understandable and are a part of this invention.

It will also be appreciated that one or more of the elements depicted in the drawings/figures can also be implemented in a more separated or integrated manner, or even removed or rendered as inoperable in certain cases, as is useful in accordance with a particular application.

Benefits, other advantages, and solutions to problems have been described above with regard to specific embodiments. However, the benefits, advantages, solutions to problems, and any component(s) that may cause any benefit, advantage, or solution to occur or become more pronounced are not to be construed as a critical, required, or essential feature or component.

What is claimed is:

1. A relay assembly, comprising:
   a vital relay used in a vital circuit and configured to be rack-installed in an equipment room in a wayside case or a housing;
   a plurality of vital relay contacts to which a current flow is restricted by a single supply solid-state current limiter;
   a relay socket base assembly coupled to the vital relay, the relay socket base assembly including:
     a relay socket base including a plurality of vital relay contact prongs,
     a plug assembly including a plurality of printed circuit board (PCB) mounted contact terminals, and
     a plurality of contact terminals that provide a connection between the plurality of vital relay contact prongs and the plurality of printed circuit board (PCB) mounted contact terminals; and
   an ancillary electrical control module, wherein the relay socket base including:
     a plugboard, and
     a contact terminal receptacle, wherein the relay socket base assembly includes a plurality of insulators that separate the plurality of contact terminals, wedges the plurality of contact terminals against the plurality of vital relay contact prongs and secures the contact terminal receptacle to the plugboard of the relay socket base, wherein each insulator of the plurality of insulators comprise a socket insert terminal holder and a snap lock feature.

2. The relay assembly of claim 1, wherein the plug assembly includes a plurality of contact terminal inserts to house the plurality of printed circuit board (PCB) mounted contact terminals.

3. The relay assembly of claim 1, wherein the plurality of printed circuit board (PCB) mounted contact terminals of the plug assembly provides a connection to one or more module circuits.

4. The relay assembly of claim 1, further comprising:
an optional modular three-connection, solid-state flasher module configured to mount without an additional bracket; and
one or more circuit protection modules that include over-current protection circuits.

5. The relay assembly of claim 1, further comprising:
at least one circuit protection module mounted on the plug assembly; and
at least one jumper module mounted on the plug assembly.

6. The relay assembly of claim 1, wherein the plug assembly includes one or more printed circuit board (PCB) connectors for relay contacts.

7. The relay assembly of claim 1, wherein the plug assembly further comprising:
one or more module circuits;
a board with a wire trace that provides a landing point for external wiring and connects the external wiring to the one or more module circuits; and
a stand off.

8. A method of providing a modular solid-state current-limiting via a relay assembly, the method comprising:
providing a vital relay used in a vital circuit and configured to be rack-installed in an equipment room in a wayside case or a housing;
providing a plurality of vital relay contacts to which a current flow is restricted by a single supply solid-state current limiter;
providing a relay socket base assembly coupled to the vital relay, the relay socket base assembly including:
a relay socket base including a plurality of vital relay contact prongs,
a plug assembly including a plurality of printed circuit board (PCB) mounted contact terminals, and
a plurality of contact terminals that provide a connection between the plurality of vital relay contact prongs and the plurality of printed circuit board (PCB) mounted contact terminals; and
providing an ancillary electrical control module, wherein the relay socket base including:
a plugboard, and
a contact terminal receptacle, wherein the relay socket base assembly includes a plurality of insulators that separate the plurality of contact terminals, wedges the plurality of contact terminals against the plurality of vital relay contact prongs and secures the contact terminal receptacle to the plugboard of the relay socket base, wherein each insulator of the plurality of insulators comprise a socket insert terminal holder and a snap lock feature.

9. The method of claim 8, wherein the plug assembly includes a plurality of contact terminal inserts to house the plurality of printed circuit board (PCB) mounted contact terminals.

10. The method of claim 8, wherein the plurality of printed circuit board (PCB) mounted contact terminals of the plug assembly provides a connection to one or more module circuits.

11. The method of claim 8, wherein the relay assembly further comprising:
an optional modular three-connection, solid-state flasher module configured to mount without an additional bracket; and
one or more circuit protection modules that include over-current protection circuits.

12. The method of claim 8, wherein the relay assembly further comprising:
at least one circuit protection module mounted on the plug assembly; and
at least one jumper module mounted on the plug assembly.

13. The method of claim 8, wherein the plug assembly includes one or more printed circuit board (PCB) connectors for relay contacts.

14. The method of claim 8, wherein the plug assembly further comprising:
one or more module circuits;
a board with a wire trace that provides a landing point for external wiring and connects the external wiring to the one or more module circuits; and
a stand off.

* * * * *